United States Patent [19]

Burger et al.

[11] Patent Number: 4,788,766
[45] Date of Patent: Dec. 6, 1988

[54] METHOD OF FABRICATING A MULTILAYER CIRCUIT BOARD ASSEMBLY

[75] Inventors: Henry A. Burger, Tempe; Harold E. White, Scottsdale, both of Ariz.

[73] Assignee: Loral Corporation, New York, N.Y.

[21] Appl. No.: 51,797

[22] Filed: May 20, 1987

[51] Int. Cl.$^4$ ............... B32B 3/10; B32B 31/00
[52] U.S. Cl. ............................ 29/830; 29/846; 29/852; 156/252
[58] Field of Search ............ 29/829, 830, 846, 852; 156/252

[56] References Cited

U.S. PATENT DOCUMENTS 4,338,136  6/1983  Huie et al. ..................... 156/252
4,663,208  5/1987  Ninomiya et al. .............. 156/252

*Primary Examiner*—Carl E. Hall
*Assistant Examiner*—Taylor J. Ross
*Attorney, Agent, or Firm*—P. E. Milliken; L. A. Germain

[57] ABSTRACT

A method of fabricating a multilayer circuit board assembly capable of operating at microwave frequencies. Specifically, multilayer circuits such as complex beam forming networks and antennas having internal via holes may be fabricated in a single bonding cycle. This is accomplished by first preparing individual circuit boards (10) by pre-forming holes (18) through circuitry (14,16) etched on opposite sides of a substrate (12). The holes (18) are next selectively plated with a conductive layer (20) and then with a material (24) capable of forming a melted fusion bond and/or a solid-state fusion bond. Bonding film (56) is placed between each board-to-board interface of a multi-board assembly and the assembly of boards is subjected to a bonding cycle of heat and pressure wherein an integral unit is effected.

12 Claims, 1 Drawing Sheet

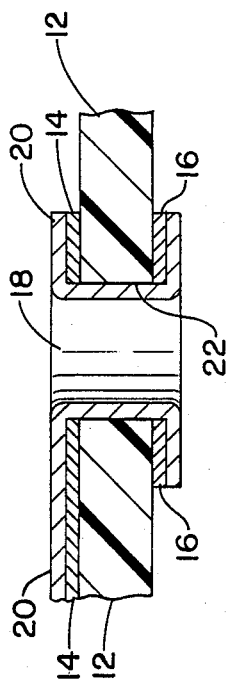
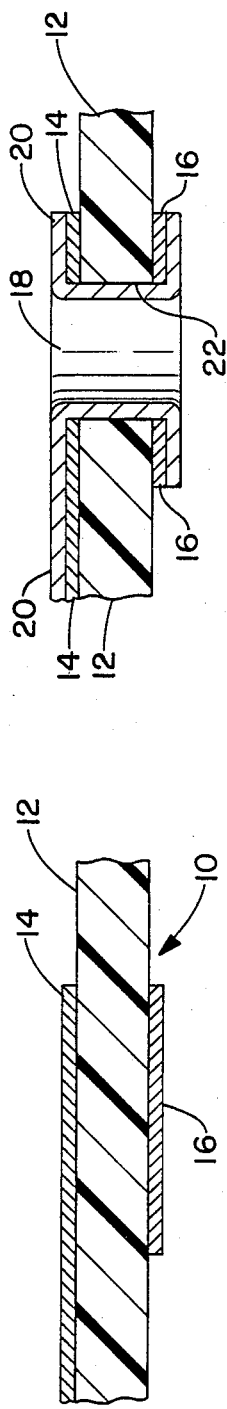
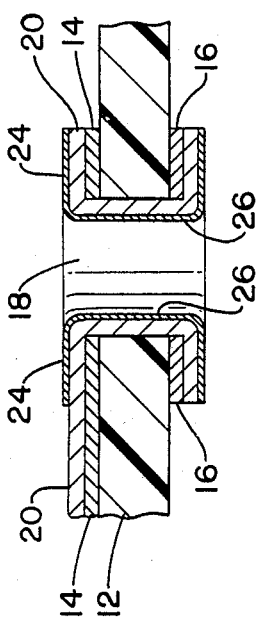
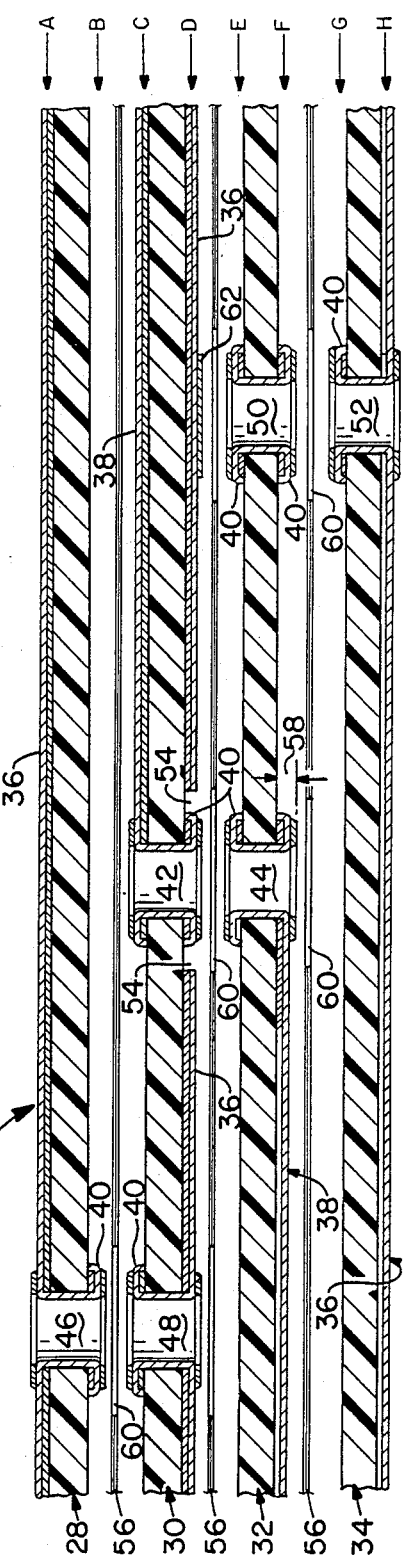

METHOD OF FABRICATING A MULTILAYER CIRCUIT BOARD ASSEMBLY

BACKGROUND OF THE INVENTION

The present invention relates to multilayer, stripline and microstrip circuit board construction and more particularly to microwave antenna construction.

Multilayer stripline circuits have heretofore been fabricated using 4 to 6 substrates to produce 2 or 3 circuit trace layers (not including ground planes). These stripline and/or microstrip devices sometimes require multiple bonding cycles to make the completed assembly. Once the substrates have been bonded together, via holes are drilled completely through the bonded assembly and plated for transferring electrical connections between different layers. This limits the circuit density and number of substrates. Generally, holes have not been drilled or plated prior to bonding because they tend to break under the high bonding temperatures and pressures encountered. The bonding material, which may comprise a bonding film between the substrates, tends to flow out of the assembly under the influence of the high temperature and pressure. As more and more of the bonding material flows out, the pressure is transferred to the plated holes which may collapse and/or be pushed into the substrate which has been softened by the high temperature. The substrates for microwave circuits are usually thicker than for other type circuit board constructions and are comprised of Polyterafluoroethylene (PTFE) or a PTFE-based material. PTFE, however, has a high coefficient of thermal expansion and thus tends to soften at high temperatures. This results in alignment problems, distortions in the final assembly, and stress at the plated holes. Another problem is that most of the internal connections produced are not normally impedance matched, thereby decreasing the electrical efficiency.

The industry is currently trying to find methods of producing multilayer microwave circuit boards to eliminate these problems. One such effort is reported in "Microstrip Antenna Manufacturing Technology Program—Phase II Report" by Boeing Aerospace Company, Seattle, WA. This report describes methods of assembling a microstrip antenna using pure silver as a conductive bonding material and therefore requires very high temperatures and pressures to bond the circuit boards together. Such temperatures and pressures are a marked disadvantage in the production of these type microwave devices.

We believe that the present invention eliminates and/or reduces the problems that have affected the prior art as it pertains to microwave antenna construction methods and allows multiple circuit boards to be integrally bonded in a single bonding cycle using lower temperatures and pressures than herebefore used.

SUMMARY OF THE INVENTION

This invention provides a method to fabricate an improved multilayer, microwave circuit board assembly which may be used for a number of different purposes, such as complex beam forming networks and microwave antennas. The resulting circuit board assembly has a number of internal microwave connections provided by via holes extending from a conductive layer on one surface of a substrate to another conductive layer on another surface of the same substrate or on a different substrate.

The multilayer assembly is made up of a number of individual circuit boards and each board has a substrate on which a first conductive layer is formed on one surface while a second conductive layer is formed on the opposite surface. The substrate is a dielectric material which insulates the conductive layers. The conductive layers may form a ground plane, pad areas, circuit traces or a combination of pad areas and circuit traces.

Via holes are formed through the first conductive layer, the substrate, and the second conductive layer at various locations. An outer conductive material, such as copper, is applied over the first and second conductive layers and onto the side walls of the holes. A conductive bonding material may then be deposited onto the outer conductive material in the areas around the holes. This material may comprise a solder or a material, such as indium, which is capable of forming a solid-state diffusion bond.

Once the individual boards have been fabricated, they are stacked in a predetermined order and orientation with a suitable thickness of a dielectric bonding material positioned between each pair of layers. The dielectric bonding material may have apertures through it which correspond to areas where the conductive layer of one substrate is to make an electrically conductive connection with the conductive layer of an adjacent substrate. Thus, the dielectric bonding layer integrally bonds adjacent boards together while providing electrical isolation and/or electrical connections between conductive layers of the different boards.

The assembly of boards is then subjected to a cycle of heat and pressure to effect a bond between the various board layers.

It is in accordance with one aspect of this invention an object to provide an improved method of fabricating multilayer circuit boards capable of operating at microwave frequencies.

In accordance with another aspect it is an object to provide a method of bonding multiple microwave circuit boards into an integrally bonded assembly in a single bonding cycle.

In accordance with another aspect it is an object to provide a multilayer, microwave circuit board assembly having internal via holes formed before bonding.

In accordance with another aspect it is an object to provide a method of making a multilayer, microwave circuit board assembly utilizing lower temperatures and/or pressures.

In accordance with still another aspect of the invention, it is an object to provide a method of making a multilayer microwave circuit board assembly wherein internal via holes are interconnected by a solid state diffusion bond.

According to another aspect of this invention it is an object to provide a microwave antenna having matched impedance connections which do not require resonant elements.

It is in accordance with a final aspect of this invention an object to provide a method of making a multilayer circuit board, such as a microwave antenna, wherein the relative connection angle between circuit layers does not have to be any particular angle.

BRIEF DESCRIPTION OF THE DRAWINGS

The following is a brief description of the drawings in the several figures in which like reference numerals designate like elements and wherein:

FIG. 1 is a partial elevational view, in cross section, of a circuit board prior to forming holes therein;

FIG. 2 is a partial elevational view, in cross section, of the circuit board shown in FIG. 1 after a hole has been formed and plated;

FIG. 3 is a partial elevational view, in cross section, of the circuit board shown in FIG. 2 after a second plating operation; and FIG. 4 is an elevational view, in cross section, of a multilayer circuit board assembly prior to bonding into an integral unit.

DESCRIPTION OF THE INVENTION

This invention provides a method of fabricating a multilayer microwave circuit board in a single bonding process. The multilayer circuit board comprises a number of circuit boards, each having one or more electrically conductive layers which are bonded or laminated together. Each of the circuit boards is initially prepared prior to the final bonding process. In a microwave antenna or circuit board construction, there are generally two types of internal connections. One comprises ground plane shorts (mode supression) which electrically interconnect one ground plane to another. A second comprises interconnections which connect the signal circuitry of one layer to the signal circuitry of another layer. A typical interconnection of either of these two types completely penetrates two substrates, and elements on opposite sides of one substrate or layer may be interconnected and/or any number of layers may be interconnected. The angle of the connection does not require any fixed relative direction which is the case with coupled slots. The angle of connection is shown herein as 0° (no change in direction) but could be any angle. Furthermore, this type of connection should have no inherent bandwidth restriction and should operate from d.c. to the upper frequency limit of the circuity.

Individual Circuit Board Preparation

FIGS. 1 through 3 illustrate a process for preparing individual circuit boards. Referring to FIG. 1, a portion of a circuit board is shown and generally indicated by reference numeral 10. The board 10 comprises a substrate 12 and a first electrically conductive layer 14 on one facing surface of the substrate 12 and a second electrically conductive layer 16 on the opposite facing surface. The substrate 12 comprises a dielectric material of a type conventionally used for microwave printed circuitry and provides a predetermined spacing between the first and second conductive layers 14,16. In particular the substrate 12 should have a dielectric constant and a loss tangent which are suitable for use with microwave circuits. A suitable material for such use is Polyterafluoroethylene (PTFE) or PTFE-based materials. The thickness of a PTFE substrate may range from less than 15 mils to more than 250 mils, depending on the requirements of the particular circuits involved. The first conductive layer 14 is shown as a circuit trace while the second conductive layer 16 is shown as a pad or land area. However, either or both of these layers may as well be a circuit trace, pad, or ground plane and may be applied to the substrate using a variety of conventional chemical etching and/or milling techniques. The first and second conductive layers 14,16 may comprise copper but may also comprise any suitable conductive material, such as gold or aluminum. At a minimum, each hole location requires a land or pad area sufficient to anchor the plated via hole.

Referring to FIG. 2, a hole 18 has been formed through the first conductive layer 14, the substrate 12, and the second conductive layer 16. The hole 18 may be formed by mechanical drilling, laser drilling or other conventional methods. After the hole has been formed, an outer layer 20 of conductive material is deposited into the hole 18 and onto the first and second conductive layers 14,16. This outer layer 20 of conductive material attaches to the side walls 22 of the hole to form a substantially barrel-shaped deposit therein. The outer layer 20 may be deposited over the entire surface of both the first or second conductive layers 14,16 or it may be deposited locally around the hole 18 to cover an area which is substantially as wide as the land or pad areas 16. The outer layer 20 connects the first and second conductive layers 14,16 together electrically. The minimum plating thickness required is that which will accomplish an electrical interconnection between the first and second layers while also being sufficient to withstand the bonding pressures and temperatures incurred during the assembly bonding process. The maximum thickness of the outer conductive layer 20 is determined by the total maximum allowable thickness including the conductive layers 14 and/or 16 and the outer conductive layer 20. If a bonding film is used as a dielectric bonding layer (described below), it is believed that the total maximum thickness is about half of the thickness of the bond film used. Again, a number of materials may be used for the plating process, but generally they will be the same as the first and second conductive layers. If copper is used for the first and second conductive layers 14,16, then the outer conductive layer 20 should also be copper.

Referring to FIG. 3, the land area or connection site is plated or deposited with a conductive bonding material 24 onto the outer layer of conductive material 20. Some plating is expected to occur inside the hole 18 such as indicated at 26. The material used must be compatible with the bonding pressures and temperatures used. During bonding with other boards, the conductive bonding material 24 will bond with the conductive bonding material of another board either through solid-state diffusion bonding or through a melted fusion bonding. One conductive bonding material which we have found to be capable of forming a solid-state diffusion bond is indium. Solder may be used for forming a melted fusion bond as long as it may be plated onto the board and it is compatible with the bonding pressure and temperature. The minimum thickness of the solder is that which is just sufficient to make contact with the pad (usually just enough to wet the surface). The maximum thickness is dictated by the need to restrict flow away from the pads caused by the bonding cycle. The solder which is deposited inside the hole at 26 is desirable in that it will serve as a means to wick any excess melted solder during bonding. A preferred thickness of the conductive bonding layer 24 is within the range of 0.007 mm to 0.013 mm (0.0003 inches to 0.0005 inches). However, some holes may not require conductive bonding material 24 if they are to be capacitively coupled and this will be described hereinafter.

According to the above, the circuit features, circuit trace, pad area, etc., may be formed by standard procedures such as for example chemical etching of the first or second conductive layers prior to drilling any holes. However, utilizing a substrate plated (with copper, etc.) on both sides, it is possible to first drill the holes and then plate them. Once this has been done, the circuit features can be etched using standard procedures to produce a hole as depicted in FIG. 2 prior to the addition of the conductive bonding material. Another method is to partially form the circuit features, stress relieve the material, and then finish the boards to produce the holes as shown in FIG. 3.

No other processing is required before bonding other than the cleaning that may be required by the bonding process. It is recommended that the bonding follow the board assembly as quickly as possible to avoid oxidation of the conductive surfaces.

Bonding Assembly

Once all the individual circuit boards have been completed as described above, they may be bonded together simultaneously. This is illustrated in FIG. 4 wherein a multilayer circuit board assembly generally indicated by reference numeral 100 comprises four individual circuit boards 28, 30, 32, and 34, respectively. These are stacked in a specific sequence and orientation. Each individual board has two circuit layers thereon producing a total of eight circuit layers for the assembly. The circuit layers are indicated generally at A through H. The circuit layers illustrate various configurations of ground planes 36, circuit traces 38, and pad areas 40. Internal connections between circuit layers are provided by through holes or vias.

Internal feed-through connections of the circuit traces 38, circuit layers C and F, are provided by holes 42 and 44 of boards 30 and 32 respectively. Internal connections or mode suppression of the ground planes 36 of circuit layers A and D are provided by holes 46 and 48. Mode suppression holes 50 and 52 also provide an internal connection for electrically interconnecting the ground planes of boards 30 and 34. However, in order for hole 50 to attach to the ground plane 36 of board 30, a conductive bonding material 62 may be deposited onto the ground plane. This will allow the pad area 40 of hole 50 to bond with the conductive bonding material 62 and form an electrical connection. It should be noted that the feed-through hole 42 is electrically isolated at 54 from the ground plane 36.

FIG. 4 illustrates both circuit traces 38 being of stripline construction, that is, each circuit trace is bounded on the top and the bottom by a ground plane 36. However, the outer circuit layers of the multilayer assembly may be of a microstrip construction, that is, without a covering ground plane. Furthermore, the circuit traces 38 do not always need to be attached on opposite sides (circuit layers) of adjacent circuit boards. For example, one circuit trace 38 on circuit layer C could be moved and attached to circuit layer B along with the addition of a pad area 40 to circuit layer C to anchor the hole 42. Similarly, the circuit trace 38 on circuit layer F could be attached to circuit layer G with a pad on circuit layer F to anchor the hole 44. FIG. 4 is only one example of a configuration of a microwave circuit. The exact number of circuit boards and circuit layers, including their configurations, will vary depending upon the specific circuit requirements and/or applications and this invention is not considered limited by the number of circuit board layers.

Prior to bonding, a dielectric bonding layer 56 is placed between each board interface. This material provides a means for bonding one layer to another and extends over and bonds to the surfaces of the boards during the bonding process, however, apertures must be provided in it such that it does not extend over the hole openings and surrounding pad areas where electrical connections are desired. Otherwise the result will be an improper electrical and/or mechanical connection.

A number of materials may be used as a dielectric bonding layer, however, they should preferably be a non-outgasing type. It is preferred at this time to use film adhesives, otherwise known as bonding films and these include Low Density Polyethylene (LDPE), Fluorinated Ethylenepropylene (FEP), and several others. The bonding layer 56 is illustrated in the drawing as one or more layers of bonding film. The combined thickness of the dielectric bonding layer 56 should be the same as the space between the boards created by the conductive layers and the plated outer conductive layer as indicated at 58. Each bonding layer is prepared to provide apertures 60 to allow for the board-to-board interconnections as required Apertures 60 in the dielectric bonding layer 56 are required when interconnecting circuit traces 38, such as by holes 42 and 44. This provides a good continuous electrical connection between layers However, not all connections between layers need to be directly connected as they may alternatively be capacitively coupled. For example, the mode suppression between ground layers may be performed by using capacitive coupling only.

In FIG. 4, holes 46 and 48 are directly interconnected through the apertures 60 in the dielectric bonding layer 56. However, if this aperture were eliminated, the ground planes may be capacitively coupled provided that the pad areas 40 (which anchor hole 46 to circuit layer B and hole 48 to circuit layer C) are sufficiently large. In this configuration, a conductive bonding material 24 is not required since there is no mechanical connection between holes.

The films are prepared with apertures 60 at each connection site. The size of the aperture 60 is somewhat larger than the pad at the site and may be either proportional to the pad diameter or a fixed amount larger.

The circuit boards must be properly cleaned and sensitized according to the requirements of the bonding layer used. All oxide must be removed from the solder.

The boards to be bonded and the prepared bond films are stacked onto a fixture (not shown). This must be done in a clean area taking reasonable care to avoid contamination. The nature of the bond fixture is determined by the part being bonded and the nature of the heat and pressure process used, but it must provide for an accurate means for indexing of the boards to provide proper registration and a means for holding the assembly during bonding.

During assembly on the fixture, care must be taken to insure that the connection sites and the apertures in the bond film are aligned. Both connection pads must be aligned with the aperture. This is the last time such an inspection can take place.

After assembly on the fixture, it is run through a bonding heat-pressure-cooling cycle. The temperature, pressure, and time are dictated by the materials used. During this cycle, the bonding film melts and reacts with the substrates and the conductive layers to form a solid, high-strength bond. The conductive bonding material at each hole site will fuse together to make good electrical contact. Any excess conductive bonding material will flow into the holes.

The temperature ranges used during this cycle are dependent upon the conductive bonding material selected. If a solder is used, then the lowest temperature required would be the melting point of the solder. Using a standard eutectic solder of 60% tin and 40% lead, the resulting melting point would be about 185° C. (365° F.). Unfortunately, this 60/40 ratio is difficult to control, and any deviation in the ratio may change the temperature. If indium is used as a solder, then the temperature limit would be lowered to the melting point of indium, which is about 156° C. (313° F.).

Additionally, the temperatures selected must be compatible with the bonding film. Using this standard, we have determined a good temperature range to be about 156° C. (313° F.) to about 232° C. (450° F.). A more preferred temperature range would be about 182° C. (360° F.) to about 232° C. (450° F.) with the most preferred about 188° C. (370° F.) to 199° C. (390° F.).

If a conductive bonding material is selected to form a solid-state diffusion bond with the conductive bonding material of another layer, then the maximum temperature would be governed by the melting point of the material. Again, indium may be used for this process. Accordingly, the upper temperature range would be approximately 156° C. (313° F.) The lower temperature is determined by the dielectric bonding material used. Bonding films require that they melt to provide adhesion, therefore, the lower limit must be in excess of this value. It is preferred to use a LDPE bonding film and accordingly the temperature ranges would be from about 104° C. (220° F.) to about 154° C. (310° F.). A more preferred temperature range would be from about 116° C. (240° F.) to about 149° C. (300° F.). A still more preferred temperature range would be from about 121° C. (250° F.) to about 141° C. (285° F.), with the most preferred temperature being from about 135° C. (275° F.) to about 141° C. (285° F.).

The pressure applied to the assembly is also a function of the materials used. A lower limit should be sufficient to take the spring out of the boards while effecting a contact with the dielectric bonding material. If a film is used, the pressure applied should cause it to flow, but only slightly. The lower limit will thus be a function of the board thickness and the number of boards. This limit will increase as the thickness and number of the boards increases. The pressure applied during the bonding process should be about 3.45 bar to about 8.62 bar (50-125 psi). A preferred range is 3.45-6.9 bar (50-100 psi) and a more preferred range is 3.45-5.5 bar (50-80 psi).

The bonding cycle includes applying the desired pressure to the assembly while it is heated to the desired temperature. Once the desired temperature or temperature ranges have been achieved, the temperature is held for a period of time. Typically the assembly is held at the bonding temperature within the range of 12 to 20 minutes with a preferred range being from about 12 to 15 minutes. After the bonding time is reached, the assembly is cooled to an acceptable temperature and the pressure released.

Following the preferred embodiment of the above-described process, lower temperatures and pressures are exhibited. This entails using a conductive bonding material capable of forming a solid-state diffusion bond, such as indium, and applying temperatures which are not in excess of its melting point.

The above description and details have been given for the purpose of illustrating this invention and it will become apparent to those skilled in the art that various changes and/or modifications may be made therein without departing from the original spirit or scope of the invention.

What is claimed is:

1. A method of fabricating a multilayer microwave circuit board assembly comprising the steps of:

A. providing a plurality of individual circuit boards wherein each board is prepared by:
  (1) applying a first conductive layer on a facing surface of a suitable non-conductive substrate material-
  (2) applying a second conductive layer on an opposite facing surface of the substrate material;
  (3) forming at least one hold through the substrate material and said first and second conductive layers;
  (4) depositing a conductive layer over said first and second conductive layers sufficient to also be deposited onto the sidewall surfaces of each said formed hole to establish an electrical interconnection between said first and second conductive layers; and
  (5) depositing a conductive bonding material onto said previously deposited conductive material;

B. stacking said plurality of prepared circuit boards in a pre-determined order and orientation to form an assembly, adjacent circuit boards of the assembly being separated by a dielectric bonding layer material having apertures therethrough to insure an electrical interconnection between adjacently oriented boards at the aperture positions; and C. applying heat and pressure to the thusly stacked circuit boards to effect an integrally bonded and interconnected circuit board assembly.

2. The method as set forth in claim 1 wherein said deposited conductive bonding material is selectively deposited at various hole positions and the dielectric bonding material which is positioned between adjacent circuit boards has an aperture therethrough at the position of a hole having said selectively deposited bonding material such that upon the application of said bonding temperature and pressure, the conductive bonding material at the aperture positions is integrally joined.

3. The method as set forth in claim 1 wherein said deposited conductive bonding material comprises a pure plated indium which results in a solid-state fusion bond between holes at the aperture positions.

4. The method as set forth in claim 1 wherein said deposited conductive bonding material comprises a eutectic tin-lead alloy solder which results in a melted fusion bond between holes at the aperture positions.

5. The method as set forth in claim 3 wherein the bonding temperature is within the range of 104° C.-154° C. (220° F.-310° F.), and the bonding pressure is within the range of 3.45 bar-8.62 bar (50 psi-125 psi).

6. The method as set forth in claim 5 wherein the bonding temperature is within the range of 135° C.-154° C. (275° F.-310° F.), and the bonding pressure is within the range of 3.45 bar-5.5 bar (50 psi-80 psi).

7. The method as set forth in claim 4 wherein the bonding temperature is within the range of 185° C.-199° C. (365° F.-390° F.), and the bonding pressure is within the range of 3.45 bar-8.62 bar (50 psi-125 psi).

8. The method as set forth in claim 7 wherein the bonding temperature is within the range of 188° C.–199° C. (370° F.–390° F.), and the bonding pressure is within the range of 3.45 bar–5.5 bar (50 psi–80 psi).

9. The method as set forth in claim 1 wherein the thickness of the dielectric bonding material between adjacent circuit boards is approximately equal to the combined thicknesses of the first and second conductive layers, the deposited conductive material, and the deposited conductive bonding material.

10. The method as set forth in claim 1 wherein the substrate material is Polyterafluoroethylene, the first and second conductive layers and the deposited conductive material are copper, the conductive bonding material is a pure indium, the bonding temperature is within the range of 135° C.–154° C. (275° F.–310° F.) and the bonding pressure is within the range of 3.45 bar–8.62 bar (50 psi–125 psi).

11. The method as set forth in claim 1 wherein the substrate material is Polyterafluoroethylene, the first and second conductive layers and the deposited conductive material are copper, the conductive bonding material is a eutectic tin-lead alloy solder, the bonding temperature is within the range of 188° C.–199° C. (370° F.–390° F.), and the bonding pressure is within the range of 3.45 bar–5.5. bar (50 psi–80 psi).

12. The method as set forth in claim 10 wherein the dielectric bonding material comprises a non-outgasing Low Density Polyethylene (LDPE).

* * * * *